(12) United States Patent
Okuda et al.

(10) Patent No.: US 7,723,808 B2
(45) Date of Patent: May 25, 2010

(54) SEMICONDUCTOR DEVICE AND METHOD OF MANUFACTURING SEMICONDUCTOR DEVICE

(75) Inventors: Yoshifumi Okuda, Tokyo (JP); Hitoshi Wakabayashi, Tokyo (JP)

(73) Assignee: NEC Corporation, Tokyo (JP)

( * ) Notice: Subject to any disclaimer, the term of this patent is extended or adjusted under 35 U.S.C. 154(b) by 84 days.

(21) Appl. No.: 12/087,049

(22) PCT Filed: Dec. 21, 2006

(86) PCT No.: PCT/JP2006/325465

§ 371 (c)(1),
(2), (4) Date: Aug. 20, 2008

(87) PCT Pub. No.: WO2007/077748

PCT Pub. Date: Jul. 12, 2007

(65) Prior Publication Data

US 2009/0026504 A1   Jan. 29, 2009

(30) Foreign Application Priority Data

Dec. 27, 2005   (JP)   ............................... 2003-374092

(51) Int. Cl.
*H01L 27/088*   (2006.01)
(52) U.S. Cl. ...................................... 257/401; 438/284
(58) Field of Classification Search ................ 257/401; 438/284
See application file for complete search history.

(56) References Cited

FOREIGN PATENT DOCUMENTS

| JP | 8-18049 | 1/1996 |
|---|---|---|
| JP | 9-45916 | 2/1997 |
| JP | 2000-49348 | 2/2000 |
| JP | 2002-76337 | 3/2002 |
| JP | 2003-86708 | 3/2003 |
| JP | 2005-5633 | 1/2005 |
| JP | 2005-286341 | 10/2005 |
| JP | 2006-253317 | 9/2006 |

OTHER PUBLICATIONS

Ghani, T., et al., "A 90nm High Volume Manufacturing Logic Technology Featuring Novel 45nm Gate Length Strained Silicon CMOS Transistors", IEDM Technical Digest, 2003, pp. 978-980.

(Continued)

*Primary Examiner*—Douglas M Menz
(74) *Attorney, Agent, or Firm*—McGinn IP Law Group, PLLC

(57) ABSTRACT

The present invention provides a semiconductor device and a method of manufacturing a semiconductor device in which a driving force can be increased by increasing a strain amount given by a stressed film in a MOS transistor including an elevated region. On a silicon substrate, a device isolation region 102, a gate insulating film 103, a gate electrode 104, an extension 105, and a sidewall insulating film 106 are formed. After that, an elevated region is formed, and a source/drain region 108 and a silicide layer 109 are formed. Subsequently, the sidewall insulating film 106 is etched to provide a gap from the elevated region 107, and a stressed film 110 is buried in the gap.

20 Claims, 7 Drawing Sheets

OTHER PUBLICATIONS

Nouri, F., et al., "A Systematic Study of Trade-offs in Engineering a Locally Strained pMOSFET", IEDM Technical Digest, 2004, pp. 1055-1058.

Pidin, S., et al., "A Novel Strain Enhanced CMOS Architecture Using Selectively Deposited High Tensile and High Compressive Silicon Nitride Filims", IEDM Technical Digest, 2004, pp. 213-216.

Wei, A., et al., "Combining Embedded and Overlayer Compressive Stressors in Advanced SOI CMOS Technologies", SSDM Technical Digest, 2005, pp. 32-33.

Shibata, Hideki, et al., "High Performance Half-Micron PMOSFETs with 0.1UM Shallow P+N Junction Utilizing Selective Silicon Growth and Rapid Thermal Annealing" IEDM Technical Digest, 1987, pp. 590-593.

ns

SEMICONDUCTOR DEVICE AND METHOD OF MANUFACTURING SEMICONDUCTOR DEVICE

TECHNICAL FIELD

The present invention relates to a semiconductor device and a method of manufacturing a semiconductor device and, more particularly, to a structure of a MOS transistor having excellent current driving force.

BACKGROUND ART

MOS transistors have achieved higher integration and increase in current driving force by miniaturization in device dimensions, particularly, reduction in gate length. However, when the gate length is simply reduced, a problem of the short channel effect occurs. It is a phenomenon that the influence of a drain field is largely exerted on a channel just below a gate insulating film, so that off-state current increases, a threshold value sharply decreases, and variations increase. A structure of elevating a source/drain region on a silicon substrate in order to solve the problem is disclosed in a non-patent document 1.

On the other hand, it is pointed out that miniaturization of devices following the conventional trend will face to physical and economical obstacles in near future. It is therefore necessary to establish a performance improving technique by a method other than miniaturization.

A material having high carrier mobility may be used for the channel layer to improve the operation speed of a MOS transistor. It is known that when stress is applied to silicon crystal, due to a change in the band structure, scattering and effective mass decreases, and the mobility improves.

A non-patent document 2 proposes a technique of increasing the current driving force by receiving compressive strain in the channel direction by a structure in which silicon germanium with a lattice constant different from that of a silicon substrate is buried in a source/drain region, and raised from the silicon substrate. A non-patent document 3 describes that, in a MOS transistor of such a structure, the channel strain amount improves depending on the height of the elevation from the surface of the silicon substrate.

As another method, a method of forming a silicon nitride film as a stressed film on a MOS transistor is disclosed in a non-patent document 4. A non-patent document 5 describes that a cumulative effect is obtained by combination of the above techniques.

Non-patent document 1: IEDM Technical Digest, 1987, pp 590 to 593

Non-patent document 2: IEDM Technical Digest, 2003, pp 978 to 980

Non-patent document 3: IEDM Technical Digest, 2004, pp 1055 to 1058

Non-patent document 4: IEDM Technical Digest, 2004, pp 213 to 216

Non-patent document 5: SSDM Technical Digest, 2005, pp 32 to 33

DISCLOSURE OF THE INVENTION

Problem to be Solved by the Invention

The inventors of the present invention have examined the relation between a strain amount of a channel by a stressed film and the height of elevation on a MOS transistor by simulation. FIG. 1 is a cross section of a MOS transistor used for the simulation. A MOS transistor formed on a silicon substrate 101 includes an elevated source-drain region 107 made of silicon. The entire MOS transistor is covered with a film having a tensile stress of 1.4 GPa.

FIG. 2 is a graph showing a result of calculation of the strain amount of the channel. When the elevation height is zero, the strain amount of the channel is the maximum. As the elevation height increases, the strain amount of the channel due to the stressed film gradually decreases. That is, when a stress nitride film exists in a region far from the channel, a strain caused by the stressed film decreases.

An exemplary object of the present invention is to solve the above problems and provide a semiconductor device and a method of manufacturing the semiconductor device having excellent current driving force.

Means for Solving the Problem

To solve the above problems, a first exemplary aspect of the invention provides a semiconductor device such as a MOS transistor including: a gate insulating film formed on a main plane of a semiconductor substrate; a gate electrode formed on the gate insulating film; a sidewall insulating film formed on side planes of the gate electrode; a source/drain region formed while sandwiching the gate electrode; an elevated region in which the source/drain region extends upward from the main plane of the semiconductor substrate while sandwiching the gate electrode and the sidewall insulating film; and a stressed film including the gate electrode and the sidewall insulating film and extending to a position adjacent to the elevated region. The sidewall insulating film and the elevated region are not in contact with each other but a gap is provided therebetween, and the stressed film is buried in the gap.

To solve the above problems, a second exemplary aspect of the invention provides a semiconductor device such as a MOS transistor including: a gate insulating film formed on a main plane of a semiconductor substrate; a gate electrode formed on the gate insulating film; a source/drain region formed while sandwiching the gate electrode; an elevated region in which the source/drain region extends upward from the main plane of the semiconductor substrate while sandwiching the gate electrode; and a stressed film including the gate electrode and extending to a position adjacent to the elevated region. The gate electrode and the elevated region are not in contact with each other but a gap is provided therebetween, and the stressed film is buried in the gap. In the second exemplary aspect of the invention, the sidewall insulating film is not provided different from the first exemplary aspect of the invention. Therefore, the larger gap is provided between the gate electrode and the elevated region, and the stressed film is buried in the gap.

To solve the above problems, a third exemplary aspect of the invention provides a semiconductor device such as a MOS transistor wherein any of single crystals of silicon, germanium, and carbon or mixed crystal thereof is buried in the source/drain region, thereby increasing the strain amount of the channel.

To solve the above problems, a fourth exemplary aspect of the invention provides a semiconductor device such as a MOS transistor wherein a semiconductor thin layer for forming the elevated region is made of any of single crystals of silicon, germanium, and carbon or mixed crystal thereof, and includes a single-layer or multilayer structure of the crystal(s).

To solve the above problems, a fifth exemplary aspect of the invention provides a semiconductor device such as a MOS transistor wherein an end of the elevated region includes a single facet plane or a plurality of facet planes.

To solve the above problems, a sixth exemplary aspect of the invention provides a semiconductor device such as a MOS transistor according the fifth exemplary aspect of the invention, wherein a main plane of the semiconductor substrate is a (100) plane, a channel direction of the gate electrode is <110>, and the facet plane is a (111) plane, a (311) plane or a (511) plane, or includes a plane direction equivalent to any of these planes.

To solve the above problems, a seventh exemplary aspect of the invention provides a semiconductor device such as a MOS transistor according to the fifth exemplary aspect of the invention, wherein a main plane of the semiconductor substrate is a (100) plane, a channel direction of the gate electrode is <100>, and the facet plane is a (110) plane, a (310) plane or a (510) plane, or includes a plane direction equivalent to any of these planes.

To solve the above problems, an eighth exemplary aspect of the invention provides a method of manufacturing a semiconductor device, including: a step of forming a gate insulating film on a main plane of a semiconductor substrate; a step of forming a gate electrode on the gate insulating film; a step of forming a sidewall insulating film on side planes of the gate electrode; a step of forming a source/drain region while sandwiching the gate electrode; a step of forming an elevated region in which the source/drain region extends upward from the main plane of the semiconductor substrate while sandwiching the gate electrode and the sidewall insulating film; a step of forming a gap between the sidewall insulating film and the elevated region; and a step of burying a stressed film in the gap.

To solve the above problems, a ninth exemplary aspect of the invention provides a method of manufacturing a semiconductor device such as a MOS transistor, wherein any of single crystals of silicon, germanium, and carbon or mixed crystal thereof is buried in formation of the source/drain region.

To solve the above problems, a tenth exemplary aspect of the invention provides a method of manufacturing a semiconductor device such as a MOS transistor wherein a semiconductor thin layer is made of any of single crystals of silicon, germanium, and carbon or mixed crystal thereof, and the elevated region is formed so as to include a single-layer or multilayer structure of the crystal(s).

To solve the above problems, an eleventh exemplary aspect of the invention provides a method of manufacturing a semiconductor device such as a MOS transistor wherein an end of the elevated region includes a single facet plane or a plurality of facet planes.

To solve the above problems, a twelfth exemplary aspect of the invention provides a method of manufacturing a semiconductor device according to the eleventh aspect of the invention, wherein a main plane of the semiconductor substrate is a (100) plane, a channel direction of the gate electrode is <110>, and the facet plane is a (111) plane, a (311) plane or a (511) plane, or includes a plane direction equivalent to any of these planes.

To solve the above problems, a thirteenth exemplary aspect of the invention provides a method of manufacturing a semiconductor device according to the eleventh aspect of the invention, wherein a main plane of the semiconductor substrate is a (100) plane, a channel direction of the gate electrode is <100>, and the facet plane is a (110) plane, a (310) plane or a (510) plane, or includes a plane direction equivalent to any of these planes.

EFFECT OF THE INVENTION

As the height of the elevated source/drain region increases, the strain amount of the channel generated by the stressed film decreases, so that the effect cannot be expected. According to the present invention, by providing the gap between the elevated region and the sidewall insulating film, the stressed film can be provided closer to the channel. Therefore, the effects of both the elevation of the source/drain region and the stressed film can be obtained. As a result, the current driving force can be improved by miniaturization of the MOS transistor and increase in the mobility.

BEST MODE FOR CARRYING OUT THE INVENTION

A semiconductor device and a method of manufacturing the same according to the present invention will now be described with reference to the drawings in detail.

First Exemplary Embodiment

FIG. 3 shows cross sections showing the structure of a MOS transistor of a first exemplary embodiment of the invention and a manufacturing method in process sequence. As shown in FIG. 3($a$), a device isolation region 102 is formed on a silicon substrate 101 as a semiconductor substrate by a well-known method. After that, a gate insulating film 103 is formed (on the main plane of the silicon substrate 101). A gate electrode material is deposited and etched, thereby forming a gate electrode 104 on the gate insulating film 103.

As shown in FIG. 3($b$), in the case of manufacturing an N-type MOS transistor by implanting ions into the silicon substrate, for example, arsenic is implanted with a dose of about $5 \times 10^{14}$ atoms/cm$^2$ at an acceleration voltage of 2 keV. In the case of manufacturing a P-type MOS transistor, for example, $BF_2$ is implanted with a doze of about $5 \times 10^{14}$ atoms/cm$^2$ at an acceleration voltage of 2 keV. In such a manner, a region called an extension 105 as a part of a source/drain structure is formed.

On the surface of the silicon substrate 101, an insulating film is deposited by using a CVD (Chemical Vapor Deposition) apparatus or a sputtering apparatus. The insulating film is, for example, a silicon oxide film or a silicon nitride film. The insulating film is not limited to a single-layer film of the silicon oxide film or the silicon nitride film but may be a laminated film thereof. Etching is performed by using, for example, an RIE (Reactive Ion Etching) apparatus as a plasma etching apparatus, thereby forming a sidewall insulating film 106 as a sidewall insulating film on the side planes of the gate electrode 104 as shown in FIG. 3($c$) and exposing a part of the surface of 101.

Next, a natural oxidation film is removed with hydrofluoric acid. The resultant is introduced into the CVD apparatus where a silicon film is grown to a thickness of about 10 to 50 nm at about 8000 using a silicon gas such as dichlorosilane (SiCl$_2$H$_2$) by, for example, an LP (Low Pressure) CVD method, thereby forming an elevated source/drain region 107 as an example of an elevated region as shown in FIG. 3($d$). That is, the elevated source/drain region 107 extends upward from the main plane of the silicon substrate 101 while sandwiching the gate electrode 104 and the sidewall insulating film 106. The semiconductor thin film layer for forming the elevated region is made of single crystal of silicon, germanium, or carbon or mixed crystal thereof, and includes a single-layer or multilayer structure of the crystal(s).

When the silicon film is grown on the sidewall insulating film 106, a leak occurs depending on the electric characteristic. Consequently, a hydrochloric (HCl) gas is supplied so that the silicon film is selectively grown only on the source/drain region and the gate. It can be realized by simultaneously supplying, for example, a germane ($GeH_4$) gas in the case of forming mixed crystal containing germanium, or by simultaneously supplying, for example, a monomethyl silane ($SiH_3CH_3$) gas in the case of forming mixed crystal containing carbon. Further, doping can be performed by supplying diborane ($B_2H_6$) or phosphine ($PH_3$) at the time of growth.

As shown in FIG. 3(*e*), in the case of manufacturing the N-type MOS transistor by ion implanting in the silicon substrate, for example, phosphorus is implanted with a dose of about $5 \times 10^{15}$ atoms/$cm^2$ at an acceleration voltage of 8 keV. In the case of manufacturing a P-type MOS transistor, for example, boron is implanted with a dose of $5 \times 10^{15}$ atoms/$cm^2$ at an acceleration voltage of 3 keV, thereby forming a source/drain region 108. After that, an RTA (Rapid Thermal Anneal) process is performed at about 1,000° C. to activate the implanted ionic species.

As shown in FIG. 3(*f*), a silicide layer 109 is formed on the elevated source/drain region 107 and the gate electrode 104 by a known method. The main component of silicide is, for example, nickel silicide. Alternately, a refractory metal silicide film made of platinum silicide, cobalt silicide, titanium silicide, tungsten silicide, or the like may be used.

As shown in FIG. 3(*g*), by etching the sidewall insulating film 106 while securing selectivity with the silicide layer 109, a gap is provided between the sidewall insulating film 106 and the elevated source/drain region 107 (that is, the sidewall insulating film 106 and the elevated source/drain region 107 are not in contact with each other). It can be realized by placing the silicon substrate 101 in plasma and performing isotropic etching by using an RIE apparatus. When selectivity can be secured, etching is performed with hydrofluoric acid as a chemical in the case where the sidewall insulating film 106 is formed by a silicon oxide film, or with phosphoric acid as a chemical in the case where the sidewall insulating film 106 is formed by a silicon nitride film.

As shown in FIG. 3(*h*), a stressed film 110 is formed on the silicon substrate 101. For example, a silicon nitride film is formed by using silicon gas such as dichlorosilane ($SiH_2Cl_2$) and ammonia ($NH_3$) by using such as a CVD apparatus. At this time, the stressed film 110 is buried also in the gap provided between the sidewall insulating film 106 and the elevated source/drain region 107. Since the stressed film 110 exists in a position close to the channel, a strain amount of the channel also becomes large. As disclosed in Japanese Patent Application Laid-open No. 2003-86708, to improve the current driving force, a stressed film by which tensile strain is applied in the channel direction in the case of an N-type MOS transistor, or a stressed film by which compression strain is applied in the channel direction in the case of a P-type MOS transistor is selected. Those films can be formed by selecting a film forming method such as an LPCVD method or a plasma CVD method, a gas mixture ratio used for film formation, and a pressure at the time of film formation.

After that, although not shown, in a manner similar to the conventional MOS transistor manufacturing method, an interlayer film is formed, a contact hole is opened, and a copper or aluminum wire is formed, thereby completing the transistor.

Second Exemplary Embodiment

FIG. 4 shows cross sections showing the structure of a MOS transistor of a second exemplary embodiment of the invention and a manufacturing method in process sequence. The second exemplary embodiment is the same as the first exemplary embodiment up to the formation of the silicide layer 109 in FIG. 4(*f*). In FIG. 4(*g*), all of the sidewall insulating film 106 is removed by etching. After that, the stressed film 110 is formed. As shown in FIG. 4(*h*), there is no sidewall insulating film (that is, the gate electrode 104 and the elevated source/drain region 107 are not in contact with each other, and there is an gap in which the stressed film 110 is buried). Consequently, the stressed film 110 is provided closer to the channel, and a stress can be applied largely.

Third Exemplary Embodiment

FIG. 5 shows cross sections showing the structure of a MOS transistor of a third exemplary embodiment of the invention and a manufacturing method in process sequence. The third exemplary embodiment is the same as the first exemplary embodiment up to the formation of the extension 105 of FIG. 5(*c*). In FIG. 5(*d*), a region which becomes the source/drain of the silicon substrate 101 is etched by about 50 nm by using an RIE apparatus, thereby forming a recess 107*a*.

Subsequently, a natural oxidation film is removed with hydrofluoric acid in a manner similar to the first exemplary embodiment. The resultant is introduced into a CVD apparatus where single crystal made of a material arbitrarily selected from silicon, germanium, or carbon or mixed crystal thereof are grown as shown in FIG. 5(*e*), thereby forming a buried layer 107*b* and the elevated source/drain region 107. In the case of an N-type MOS transistor, silicon germanium is preferred. In the case of a P-type MOS transistor, silicon carbon is preferred. An effective strain for improvement of the driving force is applied to the channel.

To form the elevated source/drain region 107, the film formation amount increases only by the range of depth of the recess 307. The process of forming the source/drain region 108 by ion implantation in FIG. 5(*f*) and the subsequent processes are the same as those in the first exemplary embodiment.

Fourth Exemplary Embodiment

FIG. 6 shows cross sections showing the structure of a MOS transistor of a fourth exemplary embodiment of the invention and a manufacturing method in process sequence. The fourth exemplary embodiment is the same as the first exemplary embodiment up to the formation of the sidewall insulating film 106 of FIG. 6(*c*). In the invention, as shown in FIG. 6(*d*), an end of the elevated source/drain region 107 has inclination to the silicon substrate 101. The inclination is generally called a facet angle. At the time of growing silicon, silicon atoms on the surface move to a surface of smaller free energy so that free energy of the whole system becomes the minimum. Consequently, growth rate varies according to the plane direction, and a facet angle is formed. For example, in the case of forming a MOS transistor whose channel direction is <110> on a silicon substrate having a (100) plane orientation, at ends of the elevated source/drain region 107, (111), (311), and (511) and equivalent planes are formed. In the case of forming a MOS transistor whose channel direction is <100>, (110), (310), and (510) and equivalent planes are formed at ends of the elevated source/drain region 107. When a facet angle with a higher level is formed, the gap between the sidewall insulating film 106 and the elevated source/drain 107 can be made larger. The shape can be arbitrarily controlled by selecting the growth method such as an LPCVD method, and a UHV (Ultra High Vacuum) CVD method, temperature, and gas flow rate.

FIG. 6(e) and the subsequent diagrams are the same as those of the first exemplary embodiment. Since the elevated source/drain 107 includes a facet angle, the amount of a stressed film 110 buried in the gap with the sidewall insulating film 106 increases. Therefore, as compared with the first embodiment in which the elevated source/drain region does not include a facet angle, the distortion amount of the channel can be made larger.

Fifth Exemplary Embodiment

FIG. 7 shows cross sections showing the structure of a MOS transistor of a fifth exemplary embodiment of the invention and a manufacturing method in process sequence. The fifth exemplary embodiment is the same as the first exemplary embodiment up to the formation of a first sidewall insulating film 106a of FIG. 7(c).

As shown in FIG. 7(d), further, an insulating film is deposited and etched, thereby forming a second sidewall insulating film 106b on the sidewalls of the sidewall insulating film 106a. As the material of the first sidewall insulating film 106a and that of the second sidewall insulating film 106b, different materials are selected.

In FIG. 7(e), the process of forming the elevated source/drain region and the subsequent processes are the same as those of the first embodiment. In FIG. 7(h), at the time of etching the sidewall insulating film, taking advantage of that the material of the first sidewall insulating film 106a and that of the second sidewall insulating film 106b are different from each other, selective etching can be performed. For example, in the case where the first sidewall insulating film 106a is made of silicon nitride and the second sidewall insulating film 106b is made of silicon oxide, only the second sidewall insulating film can be removed by hydrofluoric acid. Therefore, the controllability of formation of the gap between the elevated source/drain region 107 and the sidewall insulating film 106a improves.

Figure 1:
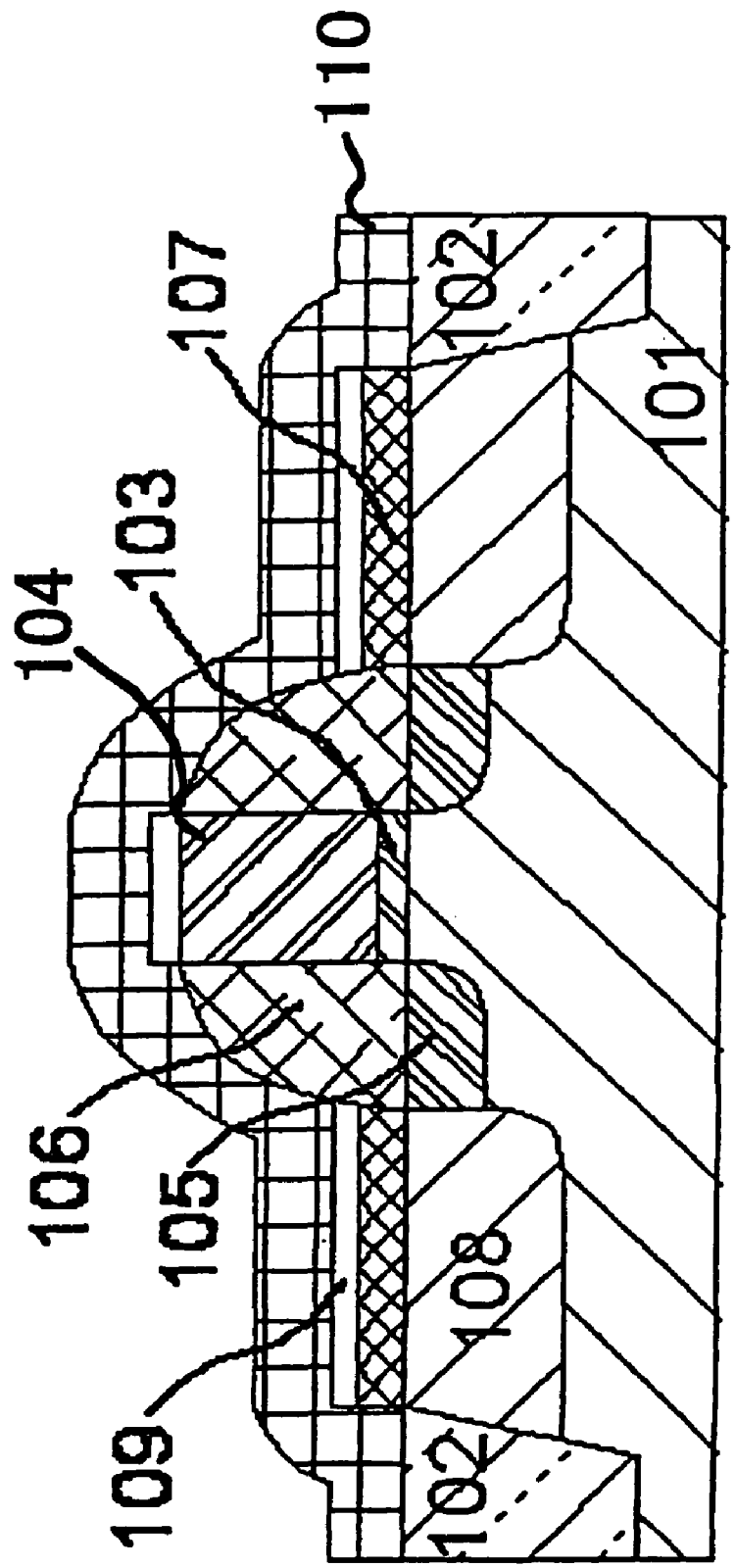
FIG. 1 is a cross section showing the structure subjected to a simulation.
Figure 2:
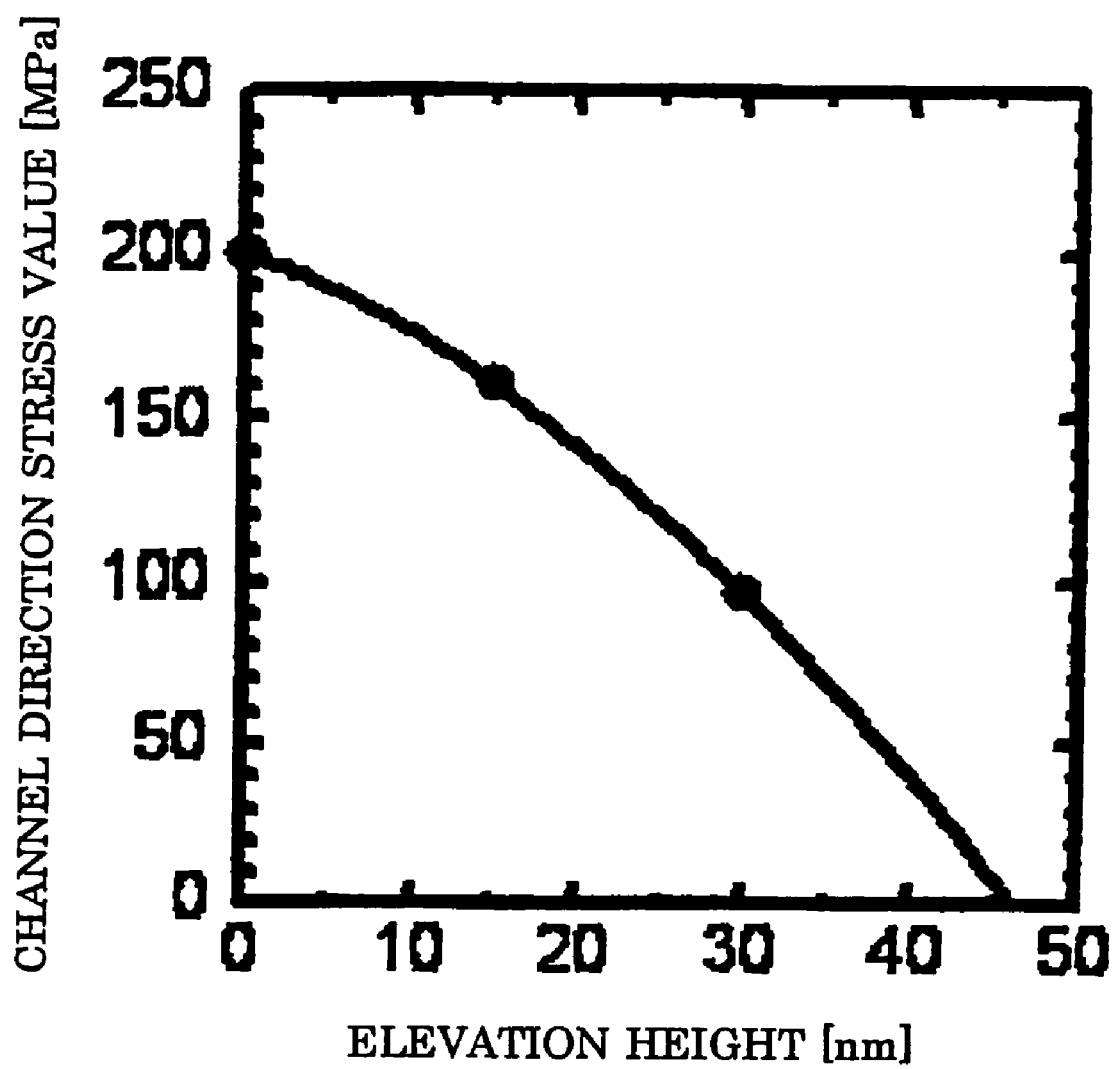
FIG. 2 is a diagram showing a simulation result.
Figure 3:
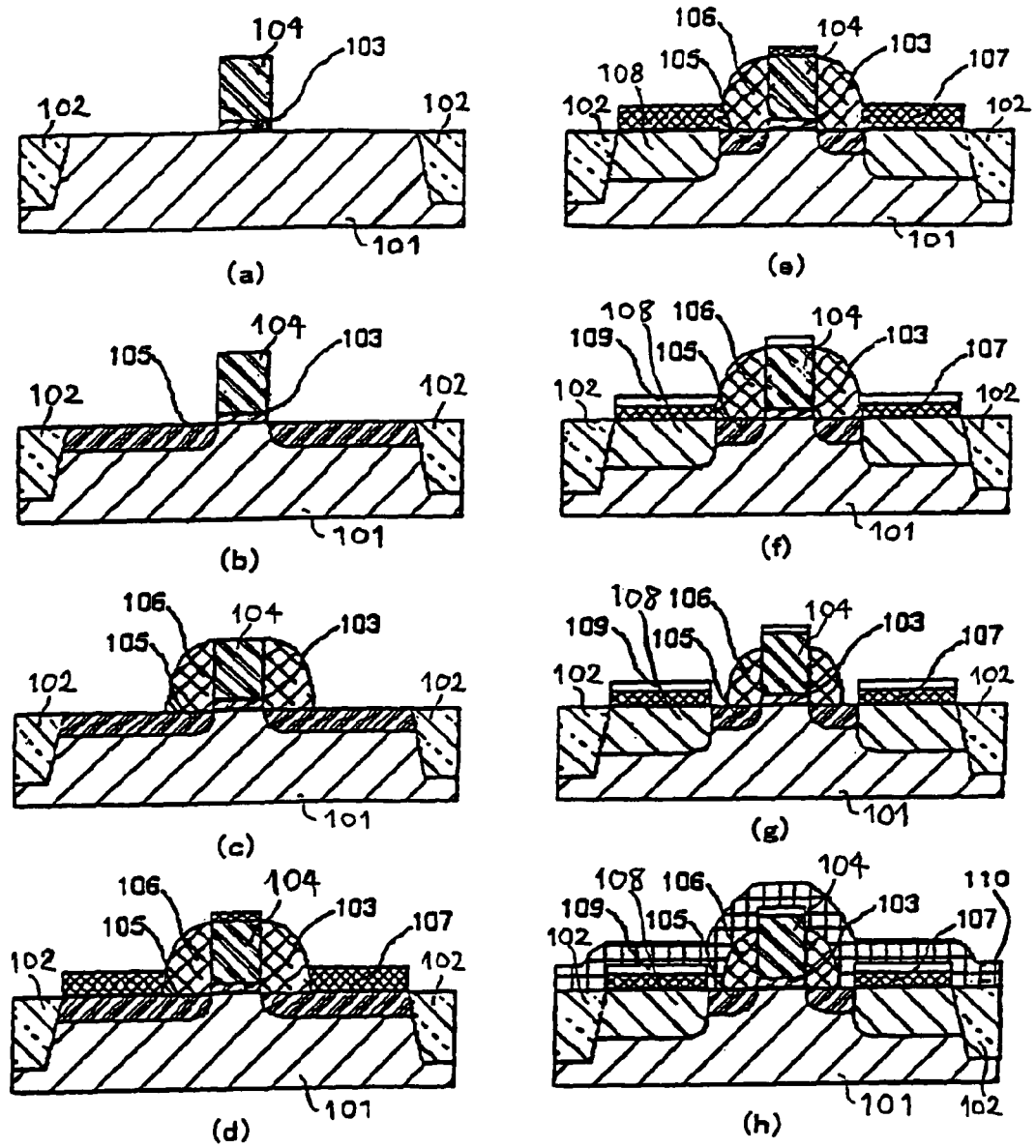
FIG. 3 shows flow diagrams of cross sections showing a structure and a manufacturing method of a first exemplary embodiment of the present invention.
Figure 4:
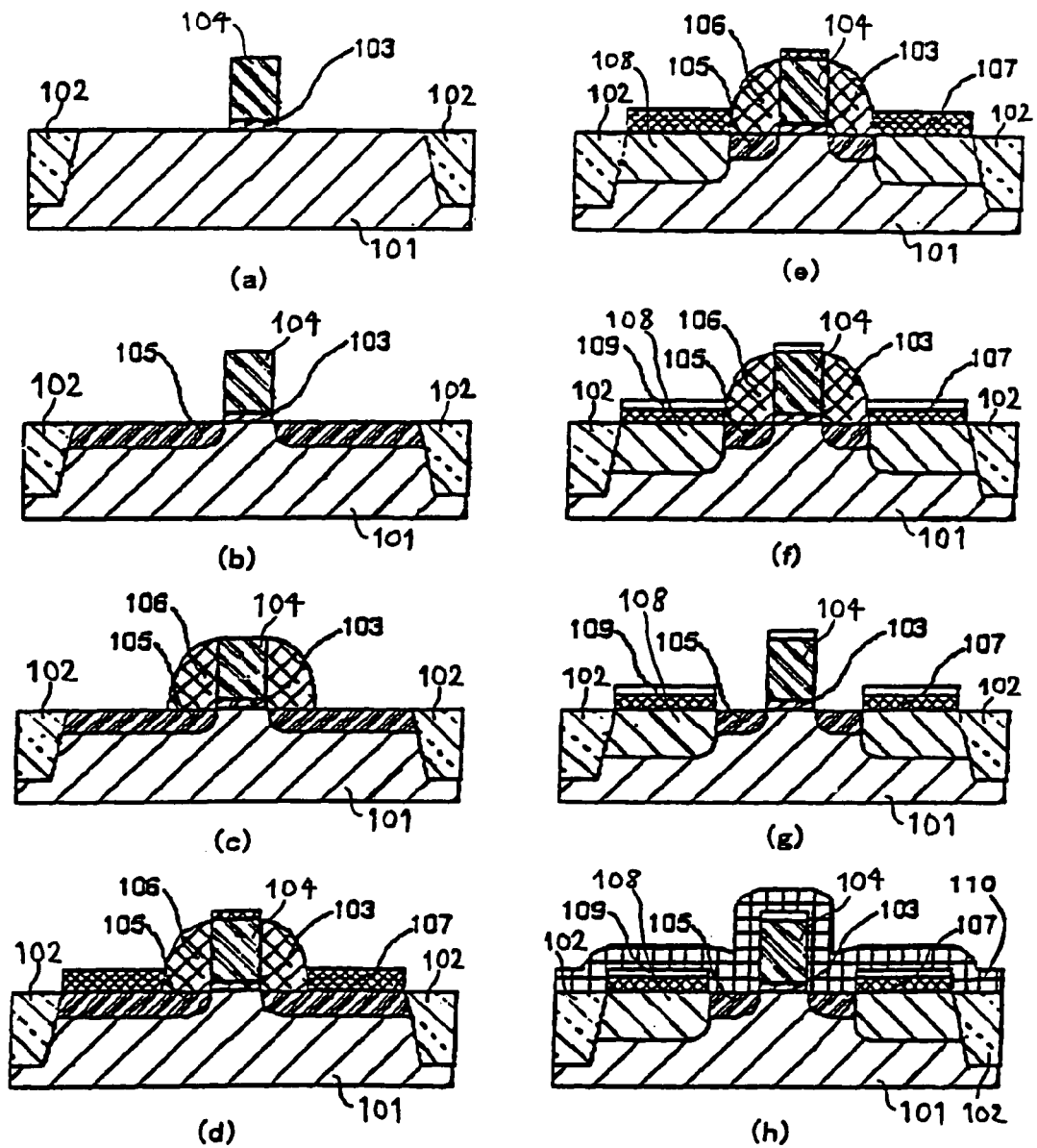
FIG. 4 shows flow diagrams of cross sections showing a structure and a manufacturing method of a second exemplary embodiment of the present invention.
Figure 5:
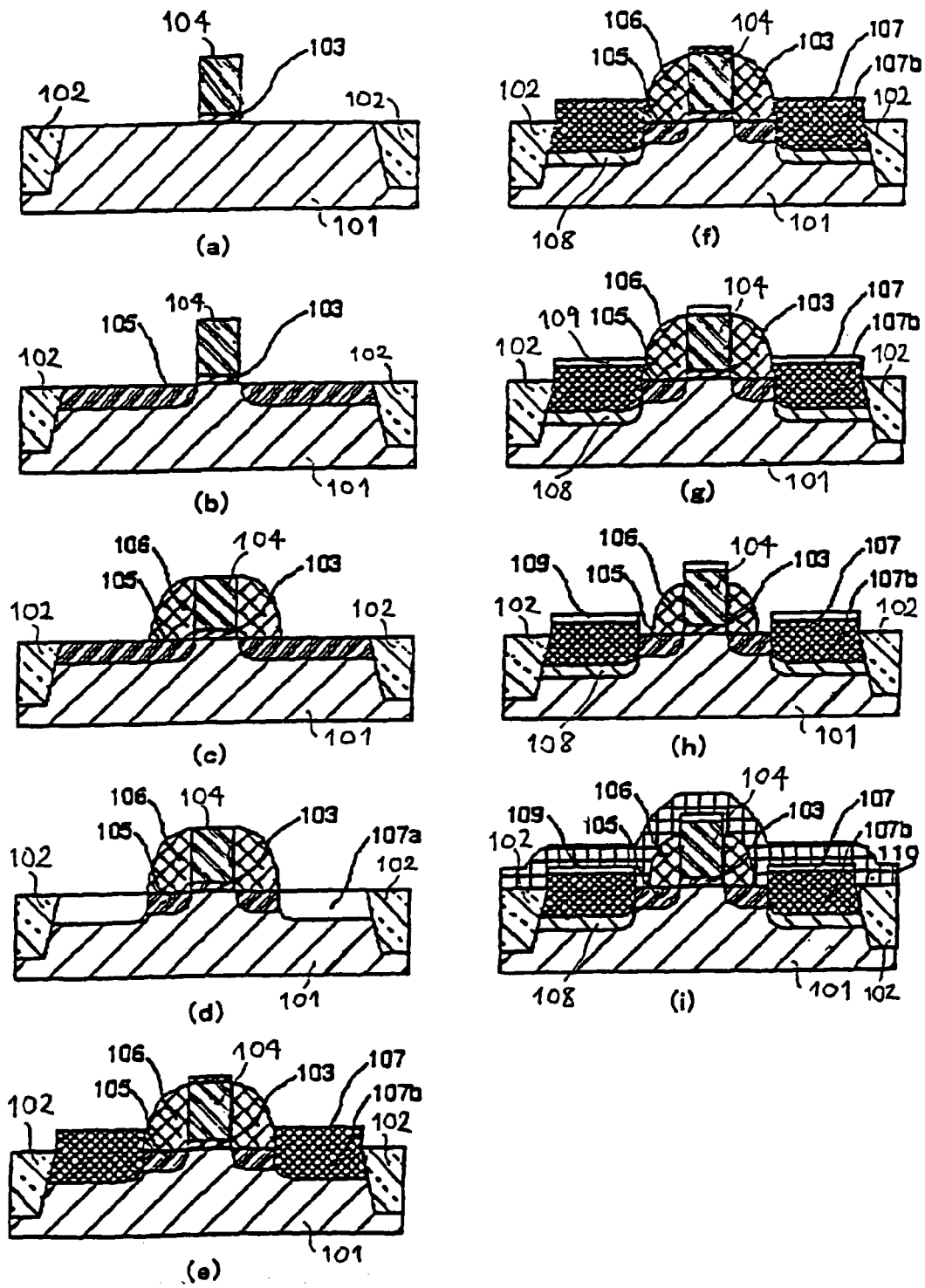
FIG. 5 shows flow diagrams of cross sections showing a structure and a manufacturing method of a third exemplary embodiment of the present invention.
Figure 6:
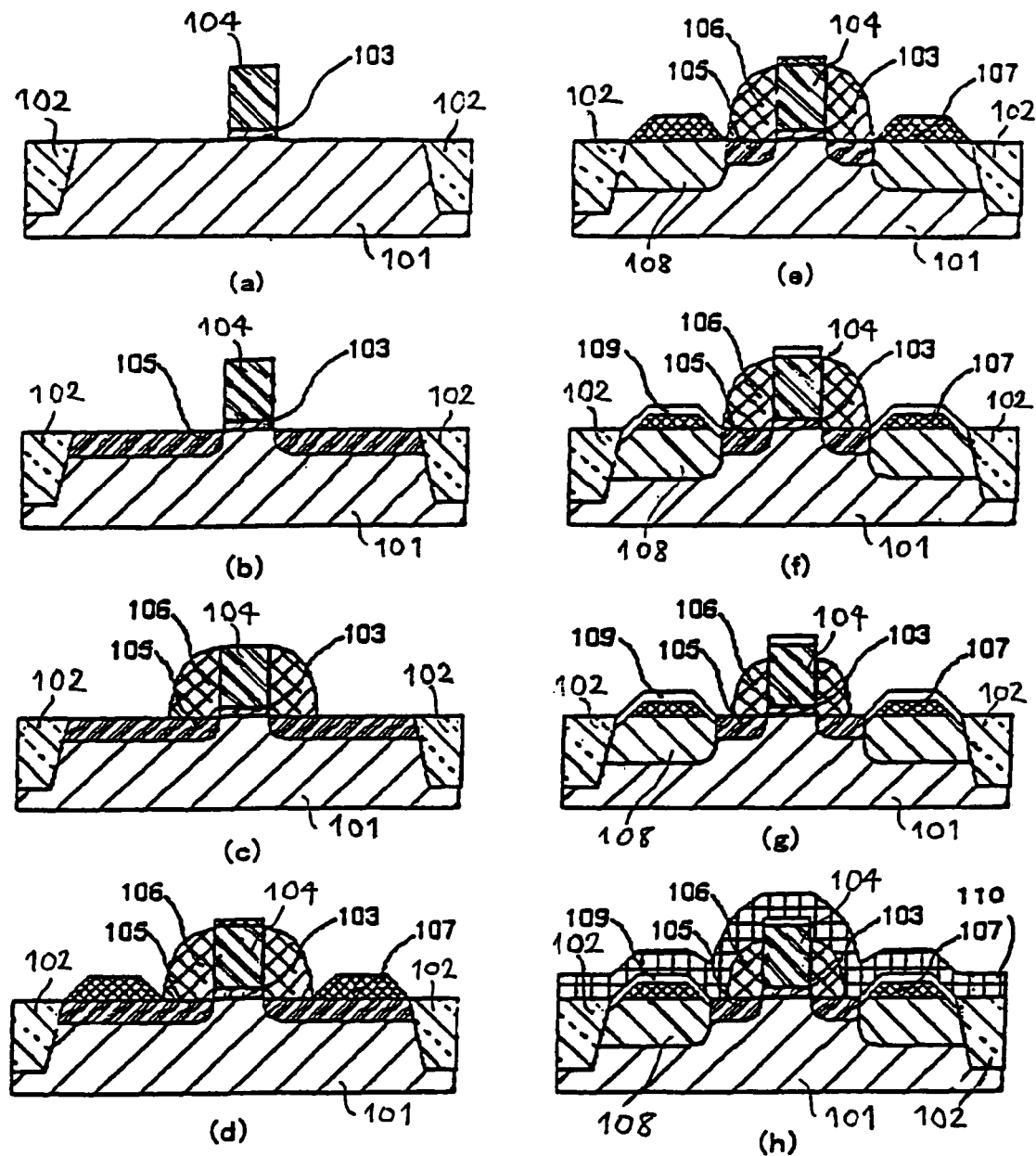
FIG. 6 shows flow diagrams of cross sections showing a structure and a manufacturing method of a fourth exemplary embodiment of the present invention.
Figure 7:
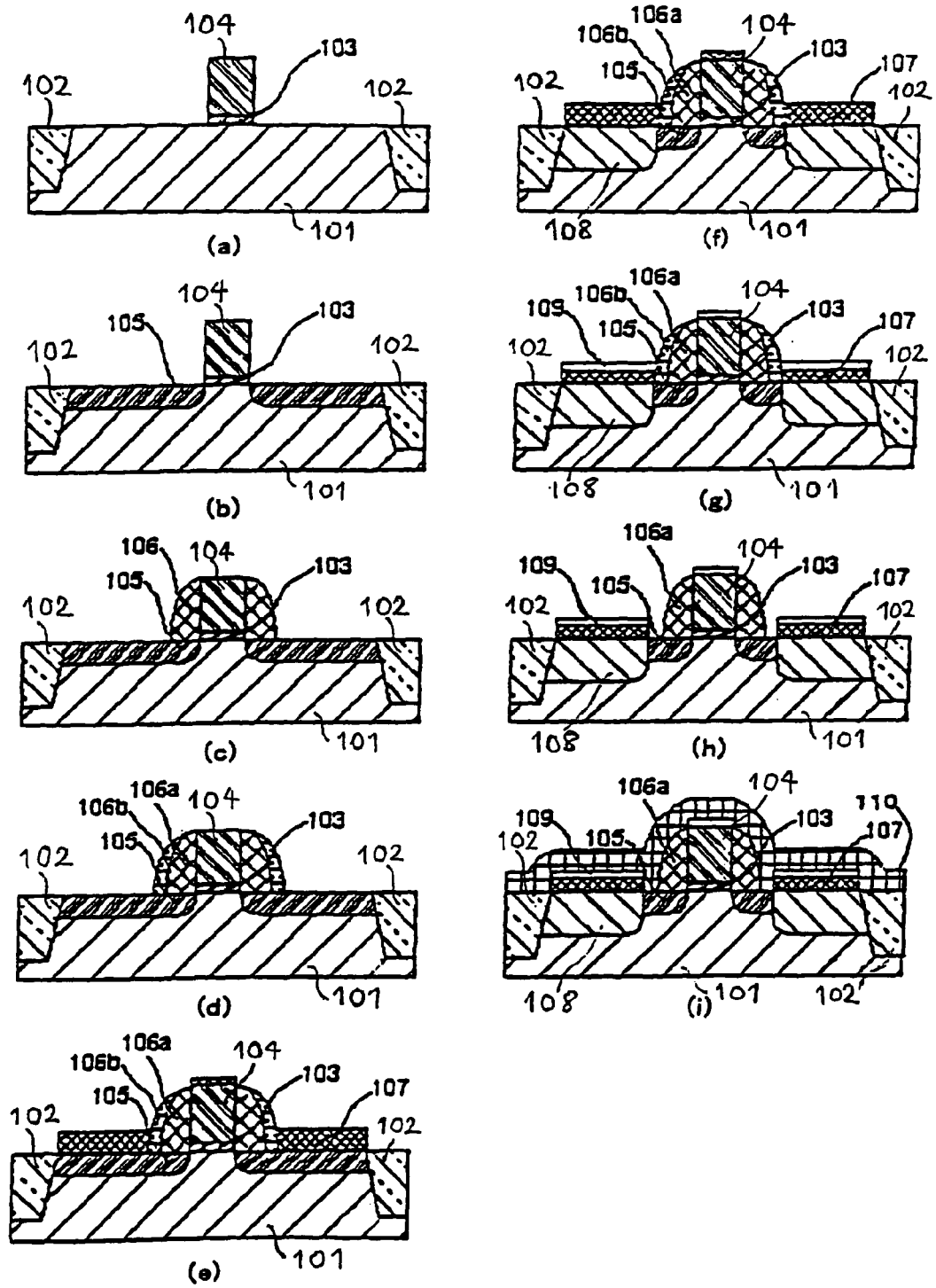
FIG. 7 shows flow diagrams of cross sections showing a structure and a manufacturing method of a fifth exemplary embodiment of the present invention.

DESCRIPTION OF REFERENCE NUMERALS 101 silicon substrate
102 device isolation region
103 gate insulating film
104 gate electrode
105 extension
106 sidewall insulating film
106a first sidewall insulating film
106b second sidewall insulating film
107 elevated source/drain region
107a recess
107b buried layer
108 source/drain region
109 silicide layer
110 stressed film

The invention claimed is:

1. A semiconductor device comprising:
a gate insulating film formed on a main plane of a semiconductor substrate;
a gate electrode formed on the gate insulating film;
a sidewall insulating film formed on side planes of the gate electrode;
a source/drain region formed while sandwiching the gate electrode;
an elevated region in which the source/drain region extends upward from the main plane of the semiconductor substrate while sandwiching the gate electrode and the sidewall insulating film; and
a stressed film including the gate electrode and the sidewall insulating film and extending to a position adjacent to the elevated region,
wherein the sidewall insulating film and the elevated region are not in contact with each other but a gap is provided therebetween, and the stressed film is buried in the gap.

2. The semiconductor device according to claim 1, wherein any of single crystals of silicon, germanium, and carbon or mixed crystal thereof is buried in the source/drain region.

3. The semiconductor device according to claim 1, wherein a semiconductor thin layer for forming the elevated region is made of any of single crystals of silicon, germanium, and carbon or mixed crystal thereof, and includes a single-layer or multilayer structure of the crystal(s).

4. The semiconductor device according to claim 1, wherein an end of the elevated region includes a single facet plane or a plurality of facet planes.

5. The semiconductor device according to claim 4, wherein a main plane of the semiconductor substrate is a (100) plane, a channel direction of the gate electrode is <110>, and the facet plane is a (111) plane, a (311) plane or a (511) plane, or includes a plane direction equivalent to any of these planes.

6. The semiconductor device according to claim 4, wherein a main plane of the semiconductor substrate is a (100) plane, a channel direction of the gate electrode is <100>, and the facet plane is a (110) plane, a (310) plane or a (510) plane, or includes a plane direction equivalent to any of these planes.

7. The semiconductor device according to claim 2, wherein a semiconductor thin layer for forming the elevated region is made of any of single crystals of silicon, germanium, and carbon or mixed crystal thereof, and includes a single-layer or multilayer structure of the crystal(s).

8. The semiconductor device according to claim 2, wherein an end of the elevated region includes a single facet plane or a plurality of facet planes.

9. The semiconductor device according to claim 3, wherein an end of the elevated region includes a single facet plane or a plurality of facet planes.

10. A semiconductor device comprising:
a gate insulating film formed on a main plane of a semiconductor substrate;
a gate electrode formed on the gate insulating film;
a source/drain region formed while sandwiching the gate electrode;
an elevated region in which the source/drain region extends upward from the main plane of the semiconductor substrate while sandwiching the gate electrode; and
a stressed film including the gate electrode and extending to a position adjacent to the elevated region,
wherein the gate electrode and the elevated region are not in contact with each other but a gap is provided therebetween, and the stressed film is buried in the gap.

11. The semiconductor device according to claim 10, wherein any of single crystals of silicon, germanium, and carbon or mixed crystal thereof is buried in the source/drain region.

12. The semiconductor device according to claim 10, wherein a semiconductor thin layer for forming the elevated region is made of any of single crystals of silicon, germanium, and carbon or mixed crystal thereof, and includes a single-layer or multilayer structure of the crystal(s).

13. The semiconductor device according to claim 10, wherein an end of the elevated region includes a single facet plane or a plurality of facet planes.

14. A method of manufacturing a semiconductor device, comprising:
forming a gate insulating film on a main plane of a semiconductor substrate;
forming a gate electrode on the gate insulating film;
forming a sidewall insulating film on side planes of the gate electrode;
forming a source/drain region while sandwiching the gate electrode;
forming an elevated region in which the source/drain region extends upward from the main plane of the semiconductor substrate while sandwiching the gate electrode and the sidewall insulating film;
forming a gap between the sidewall insulating film and the elevated region; and
burying a stressed film in the gap.

15. The method of manufacturing a semiconductor device according to claim 14, wherein any of single crystals of silicon, germanium, and carbon or mixed crystal thereof is buried in formation of the source/drain region.

16. The method of manufacturing a semiconductor device according to claim 14, wherein a semiconductor thin layer is made of any of single crystals of silicon, germanium, and carbon or mixed crystal thereof, and the elevated region is formed so as to include a single-layer or multilayer structure of the crystal(s).

17. The method of manufacturing a semiconductor device according to claim 14, wherein an end of the elevated region includes a single facet plane or a plurality of facet planes.

18. The method of manufacturing a semiconductor device according to claim 17, wherein a main plane of the semiconductor substrate is a (100) plane, a channel direction of the gate electrode is <110>, and the facet plane is a (111) plane, a (311) plane or a (511) plane, or includes a plane direction equivalent to any of these planes.

19. The method of manufacturing a semiconductor device according to claim 17, wherein a main plane of the semiconductor substrate is a (100) plane, a channel direction of the gate electrode is <100>, and the facet plane is a (110) plane, a (310) plane or a (510) plane, or includes a plane direction equivalent to any of these planes.

20. The method of manufacturing a semiconductor device according to claim 15, wherein a semiconductor thin layer is made of any of single crystals of silicon, germanium, and carbon or mixed crystal thereof, and the elevated region is formed so as to include a single-layer or multilayer structure of the crystal(s).

* * * * *